United States Patent
Kashiwada et al.

(10) Patent No.: US 10,103,198 B2
(45) Date of Patent: Oct. 16, 2018

(54) MAGNETORESISTIVE ELEMENT AND MAGNETIC MEMORY

(71) Applicant: Kabushiki Kaisha Toshiba, Minato-ku (JP)

(72) Inventors: Saori Kashiwada, Yokohama (JP); Yuichi Ohsawa, Yokohama (JP); Daisuke Saida, Shinagawa (JP); Chikayoshi Kamata, Kawasaki (JP); Kazutaka Ikegami, Kawasaki (JP); Megumi Yakabe, Kawasaki (JP); Hiroaki Maekawa, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 30 days.

(21) Appl. No.: 15/062,654

(22) Filed: Mar. 7, 2016

(65) Prior Publication Data

US 2016/0268338 A1    Sep. 15, 2016

(30) Foreign Application Priority Data

Mar. 11, 2015  (JP) ................. 2015-048492

(51) Int. Cl.
  *H01L 27/22* (2006.01)
  *H01L 43/02* (2006.01)
  *H01L 43/08* (2006.01)
  *G11C 11/16* (2006.01)

(52) U.S. Cl.
  CPC .......... *H01L 27/228* (2013.01); *G11C 11/161* (2013.01); *H01L 43/02* (2013.01); *H01L 43/08* (2013.01)

(58) Field of Classification Search
  CPC ....... H01L 27/228; H01L 43/02; H01L 43/08; H01L 23/528
  See application file for complete search history.

(56) References Cited

U.S. PATENT DOCUMENTS

| | | | |
|---|---|---|---|
| 6,605,836 | B2 | 8/2003 | Kishi et al. |
| 7,092,283 | B2 | 8/2006 | Jeong et al. |
| 7,611,911 | B2 | 11/2009 | Abraham et al. |
| 8,691,596 | B2 | 4/2014 | Nomachi |

(Continued)

FOREIGN PATENT DOCUMENTS

| | | |
|---|---|---|
| JP | 2002-100011 | 4/2002 |
| JP | 2002-280637 | 9/2002 |

(Continued)

*Primary Examiner* — Mark Prenty
(74) *Attorney, Agent, or Firm* — Oblon, McClelland, Maier & Neustadt, L.L.P.

(57) ABSTRACT

A magnetoresistive element according to an embodiment includes: a multilayer structure including a first magnetic layer, a second magnetic layer disposed above the first magnetic layer, and a nonmagnetic layer disposed between the first magnetic layer and the second magnetic layer; a conductor disposed above the second magnetic layer, and including a lower face, an upper face opposing to the lower face, and a side face that is different from the lower face and the upper face, an area of the lower face of the conductor being smaller than an area of the upper face of the conductor, and smaller than an area of an upper face of the second magnetic layer; and a carbon-containing layer disposed on the side face of the conductor.

16 Claims, 16 Drawing Sheets

(56) References Cited

U.S. PATENT DOCUMENTS

| | | | |
|---|---|---|---|
| 8,716,818 B2 | 5/2014 | Yoshikawa et al. | |
| 9,041,146 B2 * | 5/2015 | Lee | H01L 43/12 |
| | | | 257/427 |
| 9,397,288 B2 * | 7/2016 | Ohmori | H01L 43/12 |
| 9,917,247 B2 * | 3/2018 | Annunziata | H01L 43/02 |
| 2010/0097846 A1 | 4/2010 | Sugiura et al. | |
| 2010/0276768 A1 | 11/2010 | Gaidis | |

FOREIGN PATENT DOCUMENTS

| | | |
|---|---|---|
| JP | 2003-298025 | 10/2003 |
| JP | 2005-109470 | 4/2005 |
| JP | 2005-117021 | 4/2005 |
| JP | 2009-152444 | 7/2009 |
| JP | 2010-103224 | 5/2010 |
| JP | 2010-263204 | 11/2010 |
| JP | 2012-18221 A | 9/2012 |
| JP | 2013-16587 | 1/2013 |
| JP | 2013-140891 | 7/2013 |
| JP | 2013-187250 | 9/2013 |
| JP | 2013-197419 | 9/2013 |
| JP | 2013-197524 | 9/2013 |
| JP | 2014-49766 A | 3/2014 |
| JP | 2015-2281 A | 1/2015 |

\* cited by examiner

| MATERIAL | THERMAL CONDUCTIVITY (cal/cm·s·°C) | ELECTRICAL RESISTIVITY (Ω·cm) |
|---|---|---|
| C | 2.15 | $5 \times 10^{14}$ |
| Cu | 0.951 | $1.67 \times 10^{-6}$ |
| Al | 0.564 | $2.44 \times 10^{-6}$ |
| Ta | 0.137 | $1.2 \times 10^{-5}$ |
| Ti | 0.053 | $4.3 \times 10^{-5}$ |
| W | 0.425 | $5.4 \times 10^{-6}$ |
| TiN | 0.068 | $4 \times 10^{-5}$ |
| Ru | 0.279 | $6.71 \times 10^{-6}$ |
| Cr | 0.216 | $1.2 \times 10^{-5}$ |
| MgO | 0.143 | $1 \times 10^{14}$ |
| AlN | 0.072 | $1 \times 10^{14}$ |
| $Si_3N_4$ | 0.044 | $1 \times 10^{14}$ |
| $Al_2O_3$ | 0.110 | $1 \times 10^{14} - 1 \times 10^{15}$ |
| $SiO_2$ | 0.020 | $1 \times 10^{14}$ |

FIG. 4

MAGNETORESISTIVE ELEMENT AND MAGNETIC MEMORY

CROSS REFERENCE TO RELATED APPLICATIONS

This application is based upon and claims the benefit of priority from prior Japanese Patent Application No. 2015-048492 filed on Mar. 11, 2015 in Japan, the entire contents of which are incorporated herein by reference.

FIELD

Embodiments described herein relate generally to magnetoresistive elements and magnetic memories.

BACKGROUND

Magnetic random access memories (MRAMs) generally include magnetic tunnel junction (MTJ) elements, which serve as storage elements, in respective memory cells. Each MTJ element includes a reference layer of a magnetic material with a fixed magnetization direction, a storage layer of a magnetic material with a changeable magnetization direction, and a tunnel barrier layer (nonmagnetic layer) disposed between the reference layer and the storage layer. The "fixed" state of the magnetization direction of a magnetic material means that the magnetization direction of the magnetic material does not change after a write current is caused to flow between the reference layer and the storage layer. The "changeable" state of the magnetization direction of the magnetic material means that the magnetization direction of the magnetic material may change after a write current is caused to flow between the reference layer and the storage layer. The MTJ element is configured such that one of the reference layer and the storage layer, for example the reference layer, is disposed on a substrate, the tunnel barrier layer is disposed on the one of the reference layer and the storage layer, and the other of the reference layer and the storage layer, for example the storage layer, is disposed on the tunnel barrier layer.

A contact plug may be disposed on the storage layer, and a wiring line connecting to the contact plug is disposed on the contact plug in the MTJ element. The cross section of the contact plug perpendicular to the direction from the storage layer to the wiring line has substantially the same size at any point from the storage layer to the wiring line. As a result, a constant current flows in the plane of the MTJ element connecting to the contact plug.

During the manufacture of the MTJ element, the reference layer, the tunnel barrier layer, and the storage layer, which form a multilayer structure, are patterned in accordance with the planar shape of the MTJ element. During the patterning, each side portion of the multilayer structure is damaged for a distance of about 2 nm toward the inside of the multilayer structure. Electrical current flowing through the damaged portion does not effectively contribute to the spin transfer torque magnetization switching during a write operation of the MTJ element. If the size of the MTJ element is 20 nm or less, the ratio of the damaged portions to the entire cross-sectional area of the MTJ element becomes relatively high. This degrades write operation characteristics as compared to those of a larger MTJ element. In order to maintain the operation characteristics of an MTJ element with the size of 20 nm or less, the amount of current flowing through edge portions on the sides of the MTJ element needs to be decreased to reduce the ratio of the current flowing through the damaged portions.

An option to reduce the current density at the edge portions on the sides of the MTJ element is to restrict the current path for the current flowing into the MTJ element. The current path may be narrowed to the central portion of the MTJ element by reducing the cross-sectional area of the contact plug relative to the cross-sectional area of the MTJ element at the junction surface between the top surface of the MTJ element and the contact plug. As a result, the ratio of the current flowing through the central portion of the MTJ element increases. This allows the current flowing through the central portion of the MTJ element, which does not have damage, to effectively contribute to the spin transfer torque magnetization switching. As a result, a high-speed and low-current spin transfer torque magnetization switching operation is made possible. This improves the write characteristics of the MTJ element.

On the other hand, the contact plug serving as a current path may also serve as a heat conduction path. Therefore, simply narrowing the current path may lead to an increase in temperature of the MTJ element in operation since this prevents the Joule heat that is mainly generated at the tunnel insulating film of the MTJ element from being released easily. This causes a problem in that a read disturb error (erroneous writing of a cell during a read operation performed on another cell) is likely to occur during a read operation of the MTJ element. The increase in temperature of the MTJ element may also leads to a decrease in magnetization switching current and a decrease in resistance change rate (MR ratio) of the MTJ element. If the MR ratio decreases, the read current should be increased to secure the read signal intensity. As a result, the margin in the read operation decreases, and a read disturb may occur.

The narrowing of the current path may also cause a further problem of a decrease in the read signal intensity of the MTJ element since the contact resistance between the MTJ element and the contact plug increases.

BRIEF DESCRIPTION OF THE DRAWINGS

FIG. 4 is a diagram showing the thermal conductivity and the electric resistivity of carbon and materials used in the MTJ element and peripheral elements.

DETAILED DESCRIPTION

A magnetoresistive element according to an embodiment includes: a multilayer structure including a first magnetic layer, a second magnetic layer disposed above the first magnetic layer, and a nonmagnetic layer disposed between the first magnetic layer and the second magnetic layer; a conductor disposed above the second magnetic layer, and including a lower face, an upper face opposing to the lower face, and a side face that is different from the lower face and the upper face, an area of the lower face of the conductor being smaller than an area of the upper face of the conductor, and smaller than an area of an upper face of the second magnetic layer; and a carbon-containing layer disposed on the side face of the conductor.

Embodiments will now be explained with reference to the accompanying drawings.

(First Embodiment)

Figure 1:
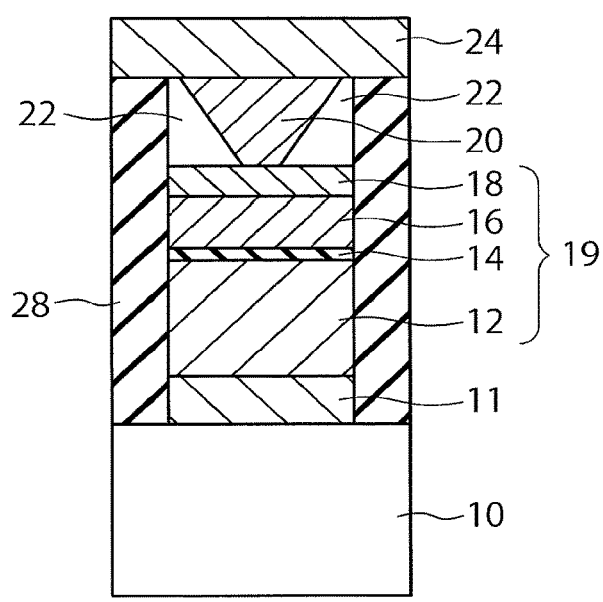
FIG. 1 is a cross-sectional view of a magnetoresistive element (MTJ element) according to a first embodiment.

FIG. 1 is a cross-sectional view of a magnetoresistive element according to a first embodiment. The magnetoresistive element 1 according to the first embodiment is an MTJ element disposed on a wiring line 11 on a substrate 10. The MTJ element includes a reference layer 12 disposed on the wiring line 11, a tunnel barrier layer (nonmagnetic layer) 14 disposed on the reference layer 12, a storage layer 16 disposed on the tunnel barrier layer 14, a cap layer 18 disposed on the storage layer 16, a conductor (for example, a contact plug) 20 disposed on the cap layer 18, the contact plug 20 having a shape in which the cross-sectional area increases in a direction from the cap layer 18 upward, like an inverse tapered shape, and a sidewall 22 disposed on a side surface of the contact plug 20. Although the MTJ element in this embodiment has a structure in which the reference layer 12, the tunnel barrier layer 14, and the storage layer 16 are stacked in this order on the wiring line 11, the stacking order may be reversed. In this case, the storage layer 16, the tunnel barrier layer 14, and the reference layer 12 are stacked on the wiring line 11 in this order. The top surface of the contact plug 20 is in contact with the wiring line 24. The wiring line 11 extends in a direction to intersect the wiring line 24. The reference layer 12 and the storage layer 16 in the first embodiment may have a perpendicular magnetic anisotropy so that the direction of magnetization in these layers is perpendicular to the film plane. Alternatively, the direction of magnetization of these layers may be in parallel with the film plane. The "film plane" herein means a plane of the magnetic layer, which is perpendicular to the stacking direction.

Figure 30:
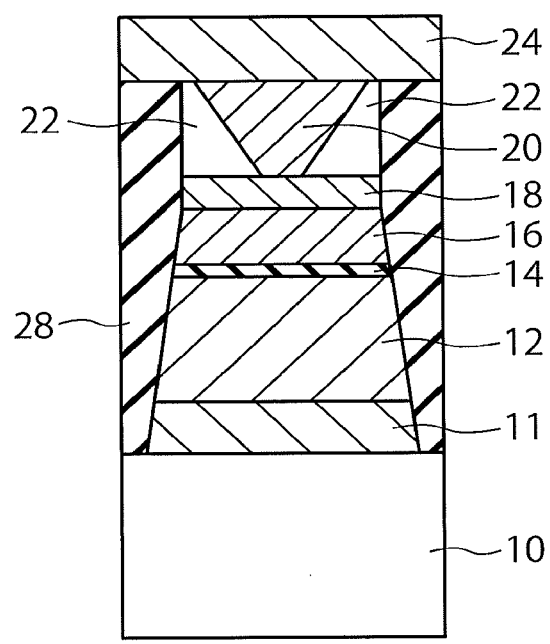
FIG. 30 is a cross-sectional view illustrating a magnetoresistive element according to a modification of the first embodiment.

The first embodiment includes a multilayer structure 19 including the reference layer 12, the tunnel barrier layer 14, the storage layer 16, and the cap layer 18. The cross section of the multilayer structure 19 along any of the planes perpendicular to the stacking direction has always the same shape. This means that junction area between the reference layer 12 and the tunnel barrier layer 14, the junction area between the tunnel barrier layer 14 and the storage layer 16, and the junction area between the storage layer 16 and the cap layer 18 are the same. The multilayer structure 19, however, may have a tapered shape in which the cross-sectional area continuously decreases from the lower surface to the top surface, as in a modification shown in FIG. 30. The junction area between the contact plug 20 and the cap layer 18 is smaller than that between the contact plug 20 and the wiring line 24. The sidewall 22 is disposed to cover the side surface of the contact plug 20, for example, and include a material having a higher thermal conductivity and a higher electric resistivity than the material of the contact plug 20. The magnetoresistive element 1 is surrounded by a protective film 28 of an insulating material, for example $SiO_2$.

The sidewall 22 with a higher thermal conductivity and a higher electric resistivity than the contact plug 20 allow heat to be efficiently released through the sidewall 22 and the current constriction effect to be maintained. As a result, an MTJ element with a high write efficiency and a low write error ratio may be achieved.

As the contact plug 20 of the first embodiment has a larger area at the top surface (on the side of the wiring line 24) than the bottom surface (on the side of the cap layer 18), the current constriction effect may be maintained, and an increase in the contact resistance may be suppressed to be a minimum level. This may improve the read signal intensity of the MTJ element 1.

In the first embodiment, the cross-sectional area of the sidewall 22 taken along a plane perpendicular to the stacking direction of the multilayer structure at the lowest portion of the side surface the contact plug 20 is larger than the cross-sectional area taken along a plane at the highest portion of the side surface the contact plug 20. The sidewall 22 includes a portion where the cross-sectional area in a plane perpendicular to the stacking direction of the multilayer structure decreases in a direction from a lower portion to a higher portion of the contact plug 20.

In the first embodiment, the outer periphery of the sidewall 22 and the outer periphery of the multilayer structure including the reference layer 12, the tunnel barrier layer 14, the storage layer 16, and the cap layer 18 have the same size (width) on the junction surface between the contact plug 20 and the cap layer 18. Thus, the thickness of the sidewall 22 of the first embodiment shown in FIG. 1 is decreased from the cap layer 18 toward the wiring line 24. The "width" herein means a maximum length of two points on the outer periphery in a cross section taken along a plane perpendicular to the stacking direction of the multilayer structure. For example, if the cross section has a rectangular shape, the width means the length of a diagonal line, and if the cross section has an oval shape, the width means the length of a long axis.

(First Modification)

Figure 2:
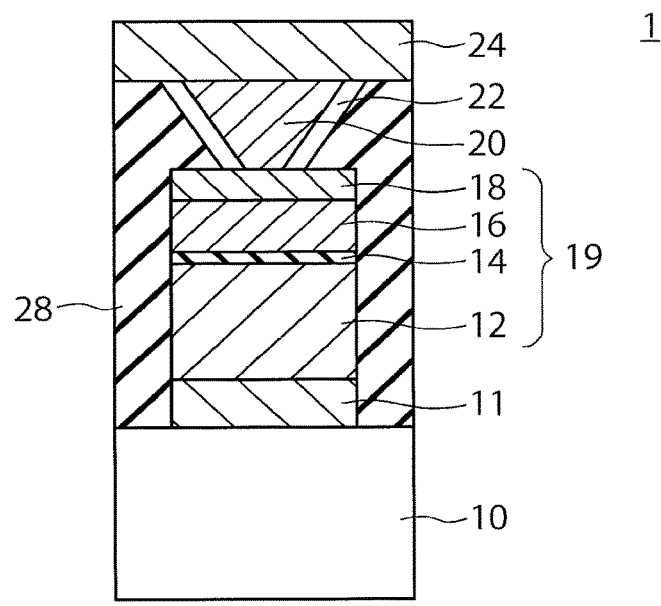
FIG. 2 is a cross-sectional view of a magnetoresistive element according to a first modification of the first embodiment.

The sidewall 22, however, may be disposed to have a substantially constant thickness along the outer shape of the contact plug 20, as in a first modification of the first embodiment shown in FIG. 2. As a result, unlike the first embodiment, the outer periphery of the sidewall 22 on a plane obtained by extending the junction surface between the contact plug 20 and the cap layer 18 is not the same as, but is smaller than, that of the multilayer structure including the reference layer 12, the tunnel barrier layer 14, the storage layer 16, and the cap layer 18 in the first modification.

(Second Modification)

Figure 3A:
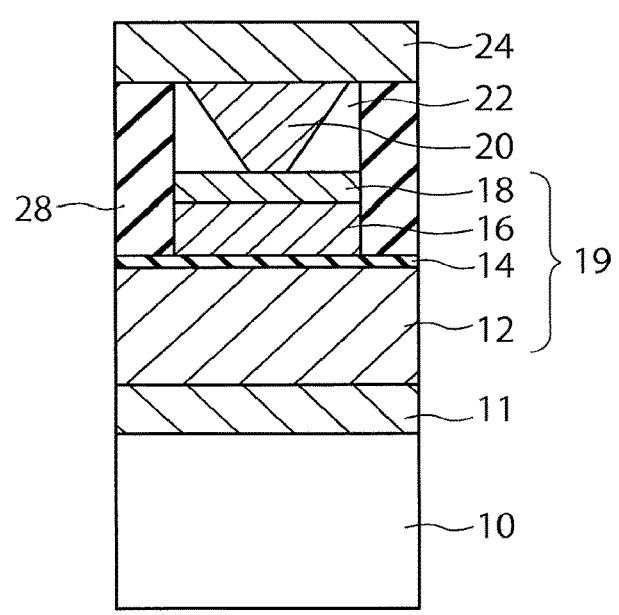
FIG. 3A is a cross-sectional view of a magnetoresistive element according to a second modification of the first embodiment.

FIG. 3A shows a cross section of a magnetoresistive element according to a second modification of the first embodiment. The magnetoresistive element 1 according to the second modification is obtained by reducing the size (width) of the outer periphery of the storage layer 16 and the cap layer 18 to be smaller than that of the reference layer 12 and the tunnel barrier layer 14 in the magnetoresistive element 1 according to the first embodiment shown in FIG. 1. This structure improves the current density in the storage layer 16 as compared to the first embodiment, thereby causing the spin transfer torque magnetization switching more easily. The cross-sectional area of the sidewall 22 of the second modification of the first embodiment in a plane perpendicular to the stacking direction of the multilayer structure at the lower end of the side surface of the contact plug 20 is larger than the cross-sectional area in a plane perpendicular to the stacking direction of the stacking direction at the top end. The sidewall 22 includes a portion where the cross-sectional area in a plane perpendicular to the stacking direction of the multilayer structure decreases in a direction from a lower portion to a higher portion of the contact plug 20.

(Third Modification)

Figure 3B:
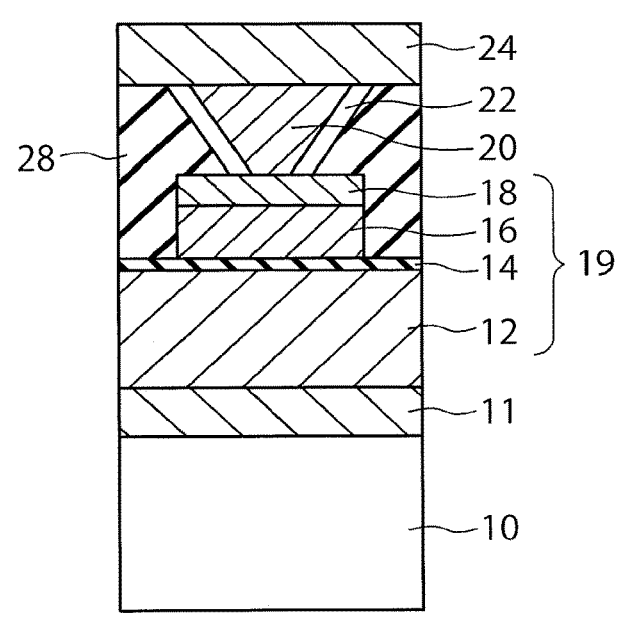
FIG. 3B is a cross-sectional view of a magnetoresistive element according to a third modification of the first embodiment.

FIG. 3B shows a cross section of a magnetoresistive element according to a third modification of the first embodiment. The magnetoresistive element 1 according to the third modification is obtained by reducing the size (width) of the outer periphery of the storage layer 16 and the cap layer 18 to be smaller than that of the reference layer 12 and the tunnel barrier layer 14 in the magnetoresistive element 1 according to the first modification of the first embodiment shown in FIG. 2. Like the second modification, the third modification improves the current density in the storage layer 16 as compared to the first embodiment, thereby causing the spin transfer torque magnetization switching more easily.

(Material of Sidewall 22)

The sidewall 22 in the magnetoresistive element 1 of each of the first embodiment and the first to third modifications will be described below.

The sidewall 22 of the contact plug 20 is formed of a material with a thermal conductivity of 1 cal/(cm·s·° C.) or more and an electric resistivity of $10^{14}$ Ω·cm or more, like carbon (C). FIG. 4 shows the thermal conductivity and the electric resistivity of carbon and materials of the MTJ element and its peripheral elements. As can be understood from FIG. 4, carbon (C) has a higher thermal conductivity than the materials of the MTJ element and electrode materials, and an electric resistivity as high as that of an insulating film. Therefore, carbon is a suitable material for the sidewall 22 of the contact plug 20. The material of the sidewall 22 preferably has the carbon atom ratio of 50 atm % or more, and the hydrogen atom ratio of 10 atm % or less.

Figure 5:
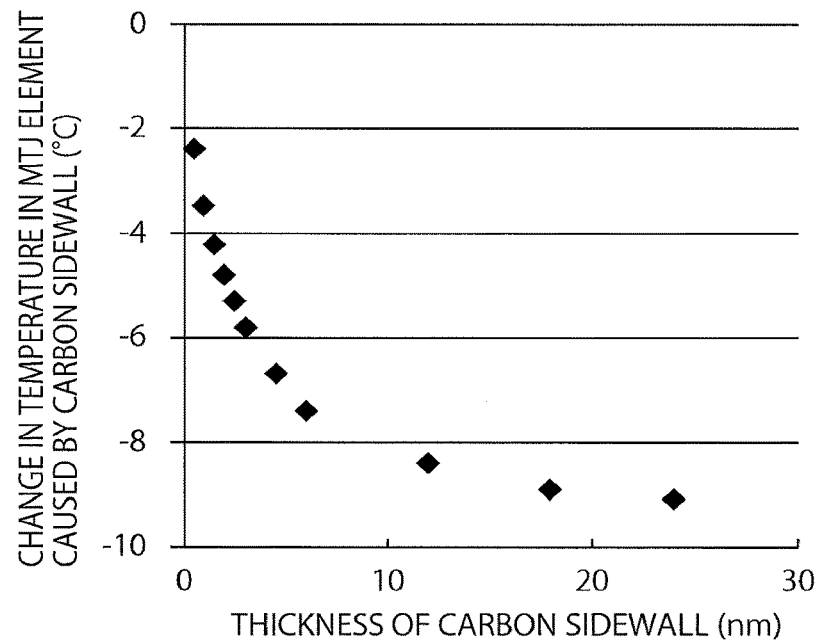
FIG. 5 is a diagram showing calculation results of changes in temperature of the magnetoresistive elements according to the first modification of the first embodiment.

An MTJ element 1 according to the first modification of the first embodiment shown in FIG. 2 is prepared, in which the sidewall is formed of carbon, the width of the cap layer 18 on a plane obtained by extending the junction surface between the cap layer 18 and the contact plug 20 is 20 nm, and the width of the contact plug 20 is 2 nm. FIG. 5 shows calculation results of changes in temperature of the MTJ elements 1, i.e., the storage layer 16 and the reference layer 12, when the thickness between the outer periphery and the inner periphery of the sidewall 22 is changed. In this case, a constant current (write current or read current) is caused to flow through this MTJ element 1. The change in temperature of the MTJ element in the negative direction in FIG. 5 means that the temperature of the MTJ element 1 decreases from the state without the sidewall 22 to the state with the sidewall 22. Even if the thickness between the outer periphery and the inner periphery of the sidewall 22 is 0.5 nm, the temperature of the MTJ element 1 decreases from the state without the sidewall 22. This means that the heat release effect of the sidewall 22 works even if the sidewall 22 is very thin. FIG. 5 merely shows calculation results. If the roughness of the actual workpiece is taken into account, the preferable thickness between the outer periphery and the inner periphery of the sidewall 22 may be 2 nm or more.

Figure 6:
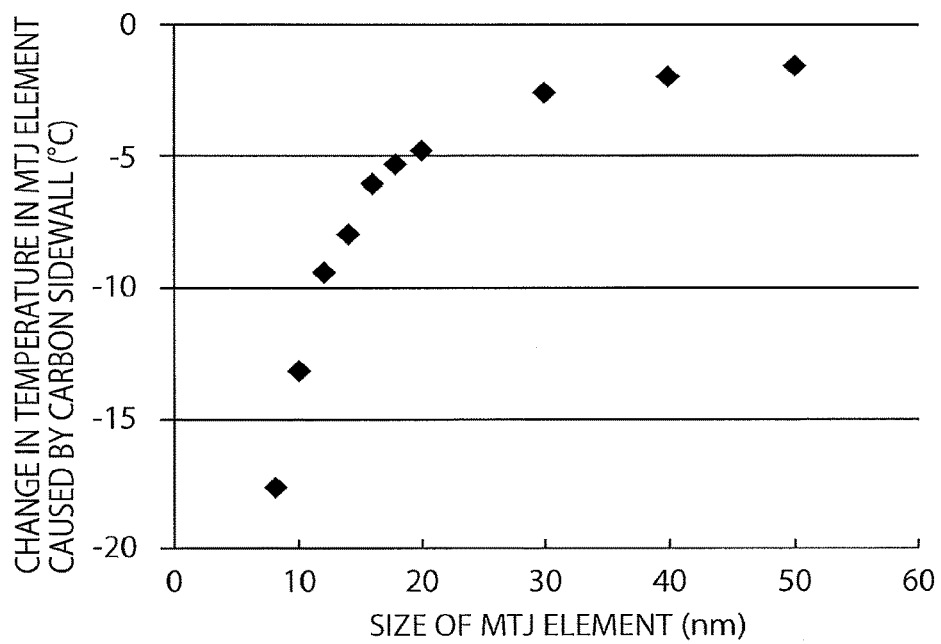
FIG. 6 is a diagram showing calculation results of changes in temperature of the magnetoresistive elements according to the first modification of the first embodiment.

An MTJ element 1 according to the first modification of the first embodiment shown in FIG. 2 is prepared, in which the sidewall is a carbon film having a thickness between the outer periphery and the inner periphery of 2 nm, and the width of the cap layer 18 is 20 nm and the width of the contact plug 20 is 2 nm on a plane obtained by extending the junction surface between the cap layer 18 and the contact plug 20. FIG. 6 shows calculation results of changes in temperature of the MTJ element 1 when the size of the MTJ element 1, i.e., the size of the storage layer 16 and the reference layer 12, is changed. The size of the storage layer 16 and the reference layer 12 means the width of these layers in a cross section take along a plane perpendicular to the stacking direction. For example, if the cross section has a rectangular shape, the size means the length of a diagonal line, and if the cross section has an oval shape, the size means the length of a long axis. The change in temperature of the MTJ element 1 in the negative direction in FIG. 6 means that the temperature of the MTJ element 1 decreases from the state without the sidewall 22 to the state with the sidewall 22. It can be seen in FIG. 6 that as the size of the MTJ element decreases, the effect of decreasing the temperature of the MTJ element 1 because of the existence of the sidewall 22 improves. In particular, it can be understood that the effect of suppressing an increase in temperature because of the existence of the sidewall is more remarkable when the size (width) of the MTJ element is 20 nm or less.

From the foregoing, the difference between the width of the storage layer 16 or the cap layer 18 and the width of the contact plug 20 on a plane obtained by extending the junction surface between the storage layer 16 or the cap layer 18 and the contact plug 20 is preferably 4 nm or more. The purpose of narrowing the cross-sectional area of the contact plug 20 is to decrease the current flowing through the damaged portions of the side portions of the MTJ element 1, and thus to prevent the contact plug 20 and the storage layer 16 or the cap layer 18 from being in contact with each other in the damaged portions. The width of the contact plug 20 is preferably 5 nm or more, and the height of the contact plug 20 is preferably 10 nm or less in order to suppress a decrease in the read signal intensity caused by the narrowing of the current path to be within about 1%.

Since the width of the contact plug 20 is narrowed in the first embodiment, the current density of the contact plug 20 becomes higher at the junction surface between the contact plug 20 and the storage layer 16 or the cap layer 18. Therefore, the contact plug may be easily degraded as time passes due to the electromigration, which may degrade the reliability of the MTJ element. In order to prevent the electromigration of the contact plug 20, the first embodiment preferably employs a carbide, a nitride, or a boride of a high-melting-point metal material to form the contact plug 20. Specifically, the contact plug 20 is preferably formed of a metal containing at least one element selected from W, Ti, Hf, Ta, Zr, and Nb, or a carbide, a nitride, or a boride of the selected metal.

As described above, according to the first embodiment and the first to third modifications, a magnetoresistive element may be provided, which is capable of performing spin transfer torque magnetization switching at a high speed and with a low current, and suppressing an increase in temperature and a degradation of the read signal intensity.

If the current path is most narrowed at the contact region between the upper electrode and a minute MTJ element with a width of 20 nm or less as described above, covering the contact region between the upper electrode and the MTJ element with a carbon-containing layer has another advantage. Generally, the sidewalls of an upper electrode are covered with an insulating material such as an oxide or a nitride. This structure may prevent the corrosion of the electrode caused by the movement of oxygen and water from an interlayer insulating film during a heat treatment process performed later. The process of forming the sidewall by CVD or sputtering has limitations since active oxygen or nitrogen and water may react with the electrode metal to cause a considerable increase in electrode resistance. The process of forming the sidewall by a heat treatment also have limitations since the reaction between the sidewall and the electrode may form a compound region having a resistance close to that of an insulating material. Covering the narrowest conductive region with carbon, which is unlikely to cause an excessive increase in resistance when reacting with the electrode metal, may lead to a stable electrode resistance, and an improved yield.

This effect to suppress an increase in contact resistance may be obtained if the contact region is not fully covered by the carbon-containing layer but a part of side surfaces of the contact is covered.

The carbon-containing layer for covering the contact region preferably contains a 3d transition metal such as Fe, Co, Mn, and Cr in order to suppress an increase in resistance in the contact region during a heat treatment. The 3d transition metal improves the thermal stability of the carbon-containing layer, and thus improves the effect of suppressing an increase in resistance in the contact region during a heat treatment.

(Second Embodiment)

Figure 7:
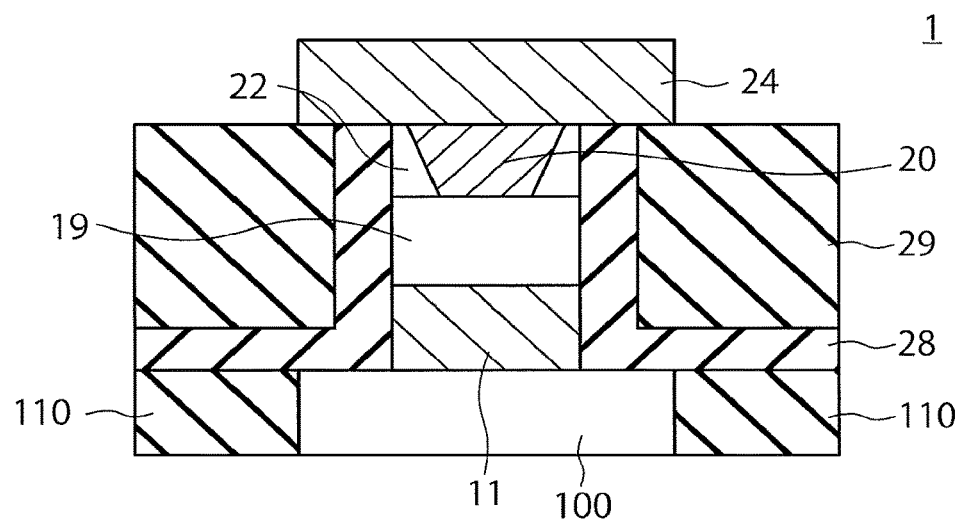
FIG. 7 is a cross-sectional view of a magnetoresistive element according to a second embodiment.

FIG. 7 shows a magnetoresistive element according to a second embodiment. The magnetoresistive element 1 according to the second embodiment is disposed on a semiconductor region 100 isolated by element isolation regions 110 of an insulating material. A wiring line 11 is disposed on the semiconductor region 100, and the magnetoresistive element 1 is disposed on the wiring line 11. The magnetoresistive element 1 is that of the first embodiment shown in FIG. 1. Therefore, the magnetoresistive element 1 includes a multilayer structure 19 disposed on the wiring line 11, a contact plug 20 having an inverse tapered shape disposed on the multilayer structure 19, and a sidewall 22 disposed on a side portion of the contact plug 20. As shown in FIG. 1, the multilayer structure 19 includes a reference layer 12, a tunnel barrier layer 14 disposed on the reference layer 12, a storage layer 16 disposed on the tunnel barrier layer 14, and a cap layer 18 disposed on the storage layer 16.

The reference layer 12 and the storage layer 16 of the second embodiment each have a perpendicular magnetic anisotropy. The multilayer structure 19 is in contact with the contact plug 20 at the top surface. The width of the contact plug 20 on the plane between the contact plug 20 and the multilayer structure is smaller than that of the multilayer structure 19. The contact plug 20 is in contact with the wiring line 24 at the top surface. The junction area of the contact plug 20 with the wiring line 24 at the top surface is greater than the junction area with the multilayer structure 19 at the lower surface.

The side surfaces of the wiring line 11 and the MTJ element 1, i.e., the side surfaces of the wiring line 11, the multilayer structure 19, and the sidewall 22 are covered by protective films 28. The protective films 28 reach the semiconductor region 100, and then extend to cover the element isolation regions 110. Interlayer insulating films 29 are disposed to cover the outer surfaces of the protective films 28.

Like the first embodiment, the magnetoresistive element 1 according to the second embodiment is capable of performing spin transfer torque magnetization switching at a high speed and with a low current, suppressing an increase in temperature, and suppressing a degradation in read signal intensity.

(Manufacturing Method)

A method of manufacturing a magnetoresistive element 1 according to the second embodiment will be described with reference to FIGS. 8 to 17.

Figure 8:
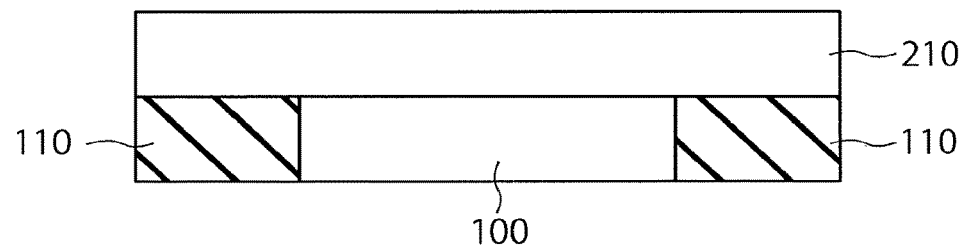
FIGS. 8 to 17 are cross-sectional views illustrating a process of manufacturing the magnetoresistive element according to the second embodiment.

First, as shown in FIG. 8, a wiring material layer 210 is disposed on a semiconductor substrate 100, on which transistors (not shown), for example, are formed. The surface of the wiring material layer 210 is flattened by CMP.

Figure 9:
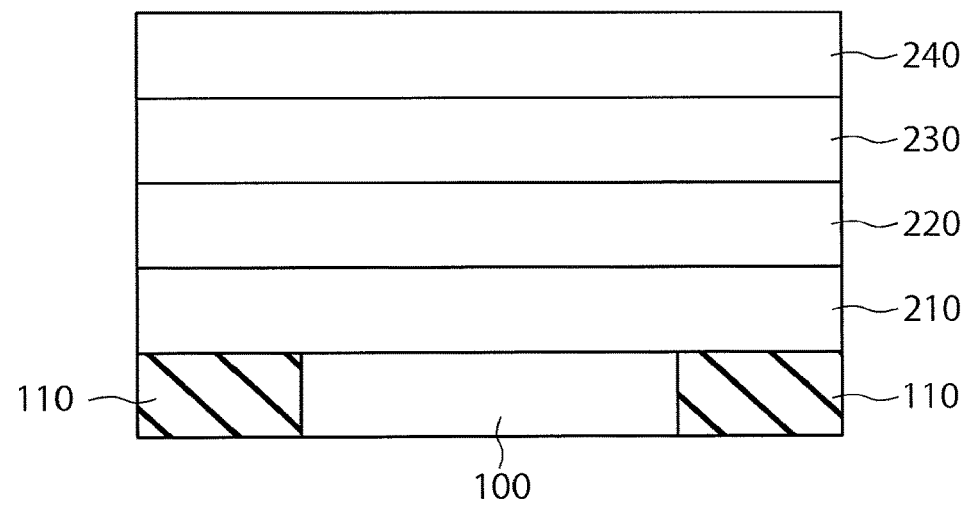

Thereafter, a material layer 220 for forming an MTJ element is disposed on the wiring material layer 210, as shown in FIG. 9. The material layer 220 includes a first magnetic material layer (not shown), which is to serve as a reference layer, a nonmagnetic material layer (not shown), which is to serve as a tunnel barrier layer, disposed on the first magnetic material layer, a second magnetic material layer (not shown), which is to serve as a storage layer, disposed on the nonmagnetic material layer, and a conductive material layer, which is to serve as a cap layer, disposed on the second magnetic material layer. A hard mask layer 230 is disposed on the material layer 220, and a resist film 240 is disposed on the hard mask layer 230. The hard mask layer 230 is formed of a high heat-conduction and high electric-resistance material containing carbon (C) and having a thermal conductivity of 1 cal/(cm·s·° C.) or more and an electric resistivity of $10 \times 10^{13}$ Ω·cm. The hard mask layer 230 is processed to form the sidewall 22.

Figure 10:
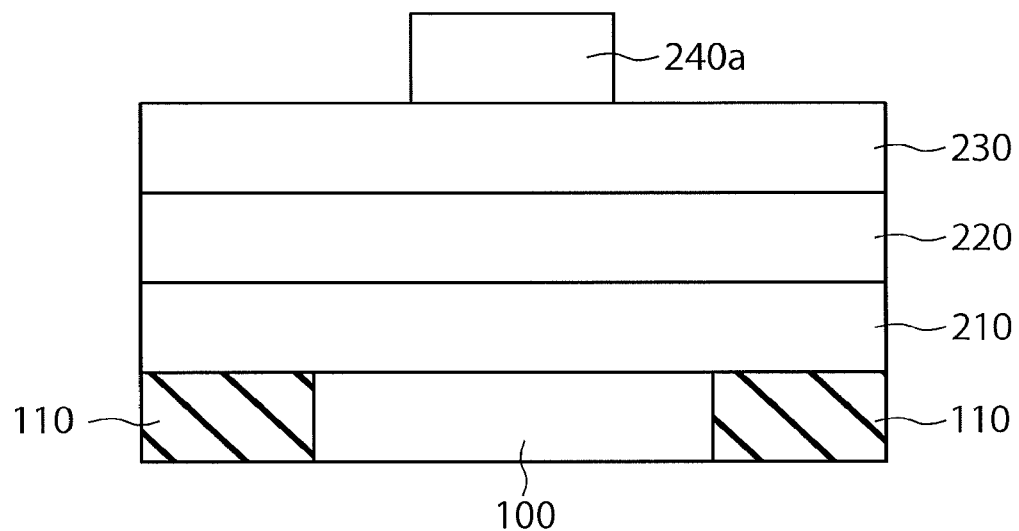

The resist film 240 is patented in a shape of the MTJ element by photolithography, as shown in FIG. 10, to form a resist pattern 240a.

Figure 11:
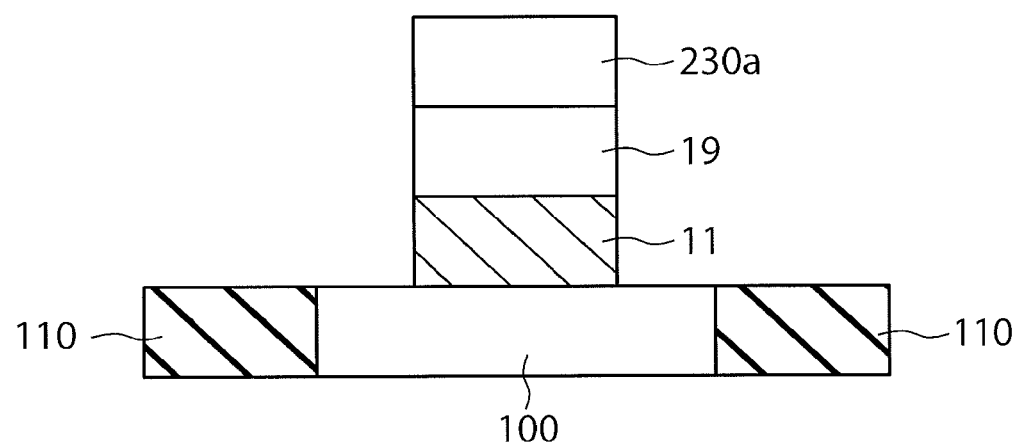

The hard mask layer 230 is anisotropically etched (by reactive ion etching (RIE), for example) using the resist pattern 240a as a mask, and thus patterned to form a hard mask pattern 230a, as shown in FIG. 11. Thereafter, the material layer 220 is anisotropically etched using the hard mask pattern 230a as a mask to pattern the material layer 220 and the wiring material layer 210. As a result, the multilayer structure 19 and the wiring line 11 of the first embodiment are formed. While the material layer 220 and the wiring material layer 210 are processed, the materials of the material layer 220 of the MTJ element and the wiring material layer 210 etched from these layers adhere to the side surfaces of the hard mask pattern 230a when the side surfaces are irradiated with ion beams. As a result, the materials of the material layer 220 of the MTJ element and the wiring material layer 210 are injected from the side surfaces to the inside of the hard mask pattern 230a.

Figure 12:
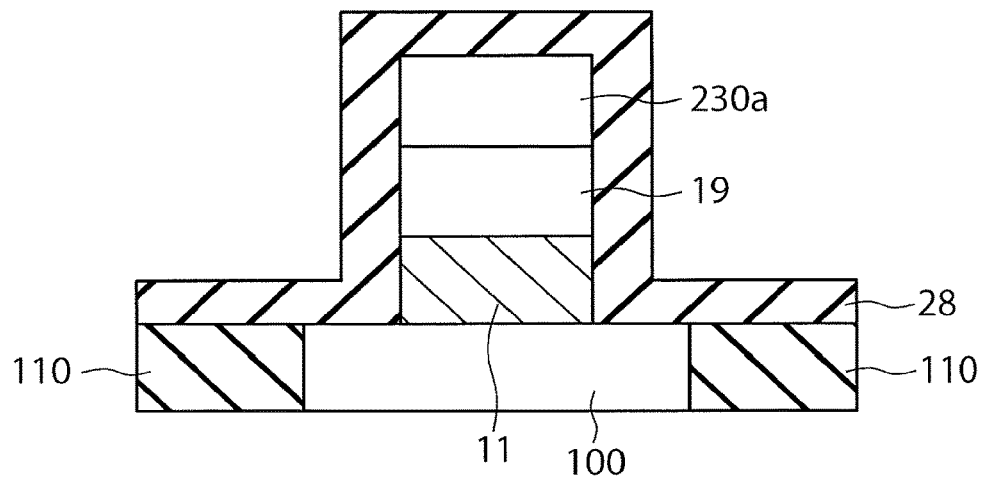

Subsequently, a protective film 28 is disposed on the entire surface of the semiconductor substrate as shown in FIG. 12. As a result, the side surfaces of the wiring line 11, the side surfaces of the multilayer structure 19, and the side surfaces and the top surface of the hard mask pattern 230a are covered by the protective film 28.

Figure 13:
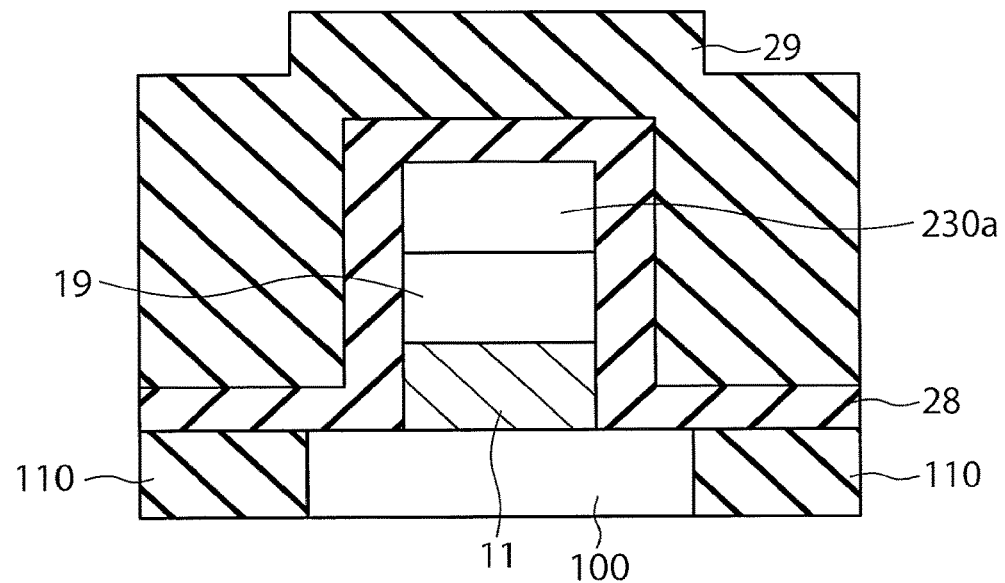
Figure 14:
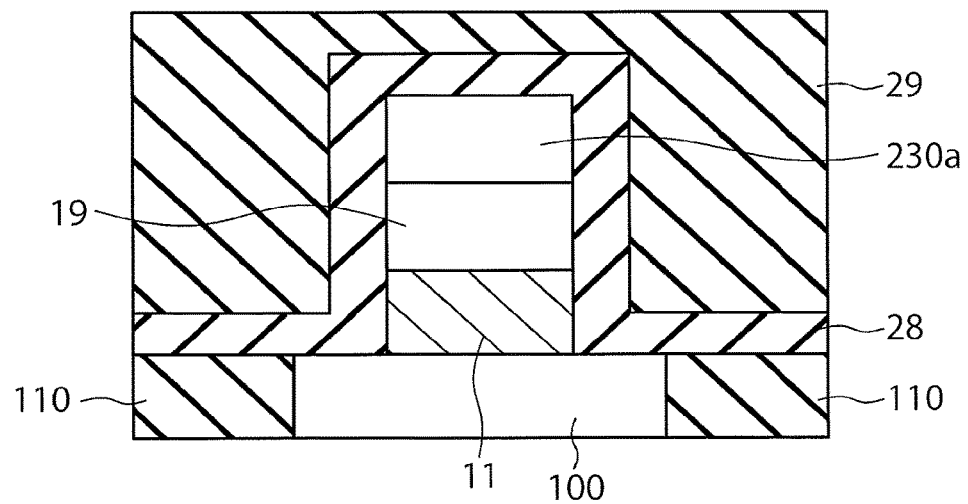

Thereafter, an interlayer insulating film 29 is disposed to cover the protective film 28 as shown in FIG. 13, and the top surface of the interlayer insulating film 29 is flattened by chemical mechanical polishing (CMP) as shown in FIG. 14. The flattening does not expose the top surface of the hard mask pattern 230a.

Figure 15:
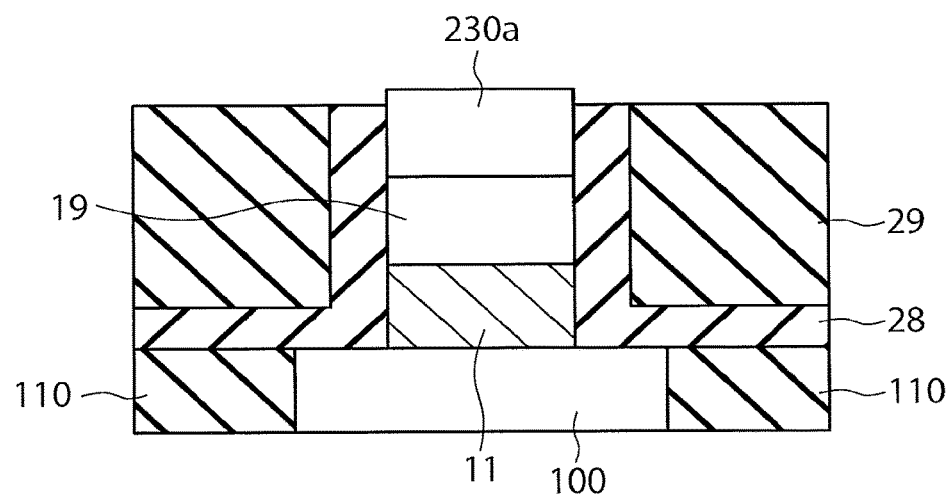

Then, the interlayer insulating film 29 is etched back by RIE until the top surface of the hard mask pattern 230a is exposed as shown in FIG. 15.

Figure 16:
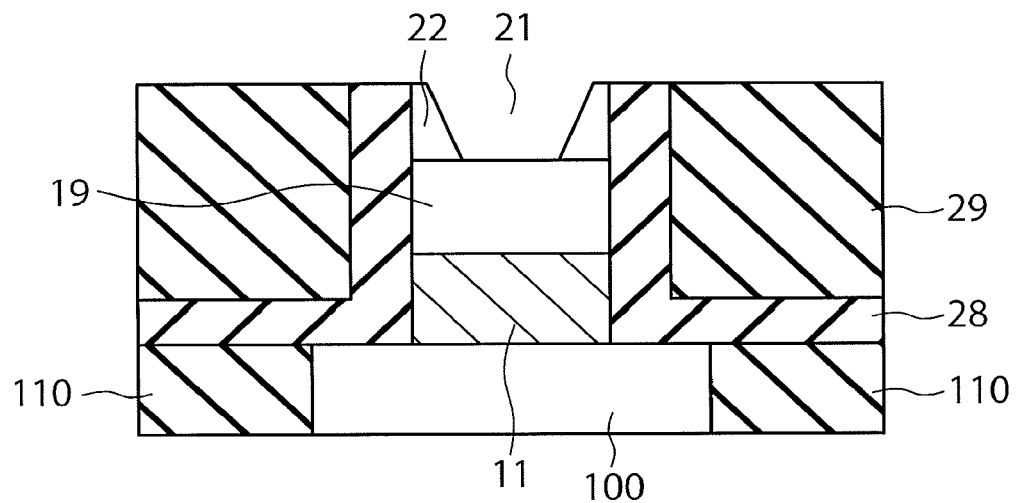

Subsequently, the central portion of the hard mask pattern 230a is etched to form a contact hole 21, the bottom of which is the top surface of the multilayer structure 19, as shown in FIG. 16. By this, the hard mask pattern 230a becomes the sidewalls film 22. Since the hard mask pattern 230a contains carbon as its main ingredient, it may be etched by RIE using oxygen gas. As described above, however, the materials of the MTJ element and the wiring line 11 are injected to the side surfaces of the hard mask pattern 230a while these layers are processed. If the assistance of oxygen ions becomes weaker, the etching rate of the side surfaces of the hard mask pattern, to which the MTJ materials are injected, also becomes lower. Since the MTJ materials have not reached the core portion of the hard mask pattern 230a, the etching rate of this portion remains high even if the assistance of oxygen ions is not satisfactory. Using this characteristic, the etching is performed by RIE with a low bias power and oxygen to leave the side surfaces of the hard mask pattern, to which the MTJ materials are injected. Specifically, the hard mask etching is performed by using, for example, an ICP-RIE apparatus, with the conditions of oxygen gas of 40 sccm, processing pressure of 15 mTorr, plasma power of 100 W, bias power of 20 W, temperature of 15° C., and overetching of 120%.

Since the etching rate is lowered by the microloading effect near the bottom of the contact hole, the contact hole 21 has a bottom area smaller than the top area as shown in FIG. 16.

Figure 17:
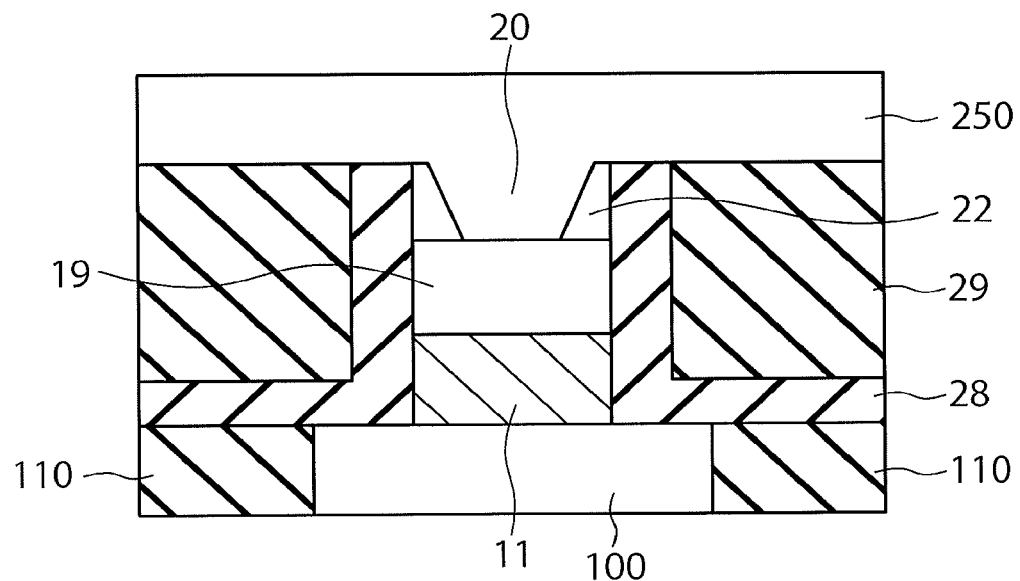

Subsequently, a wiring material layer 250 is formed to fill the contact hole 21, and to cover the top surfaces of the sidewalls 22, the protective films 28, and the interlayer insulating films 29 as shown in FIG. 17. As a result, the wiring material is filled to the contact hole 21 to form a contact plug 20 on the multilayer structure 19. Thereafter, the wiring material layer 250 is processed to form a wiring line 24 connecting to the contact plug 20, thereby forming the magnetoresistive element 1 according to the second embodiment shown in FIG. 7.

Third Embodiment

A method of manufacturing a magnetoresistive element according to a third embodiment will be described with reference to FIGS. 18 to 27. This method is for a magnetoresistive element in which the length of the outer periphery of the sidewall 22 does not match that of the multilayer structure 19, like the first modification of the first embodiment shown in FIG. 2.

Figure 18:
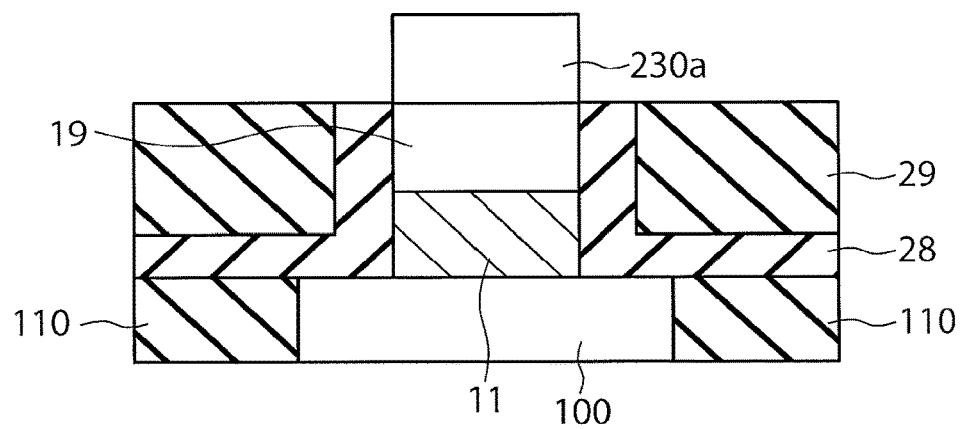
FIG. 18 is a cross-sectional view illustrating a process of manufacturing a magnetoresistive element according to a third embodiment.

The method according to the third embodiment is the same as the method according to the second embodiment for the steps shown in FIGS. 8 to 14. After the top surface of the interlayer insulating film 29 is flattened by CMP, the interlayer insulating film 29 is further etched by RIE as shown in FIG. 18. The etchback is continued until the entire portion of the hard mask pattern 230a is exposed as shown in FIG. 18.

Figure 19:
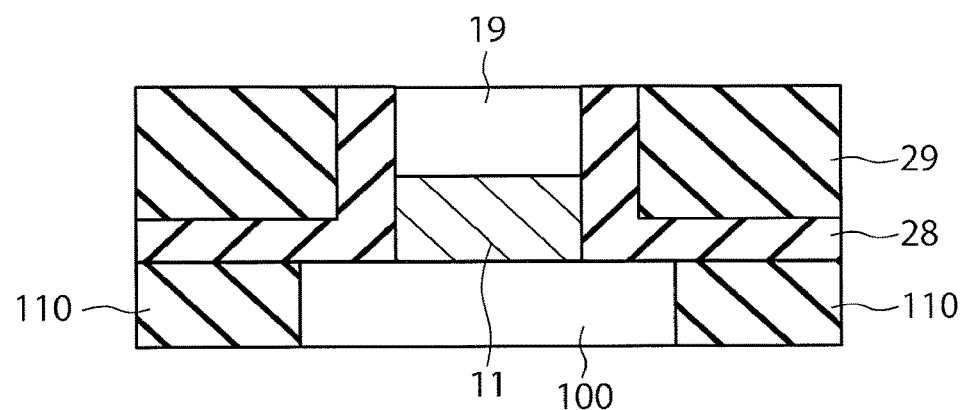
FIG. 19 is a cross-sectional view illustrating the process of manufacturing a magnetoresistive element according to the third embodiment.
Figure 20:
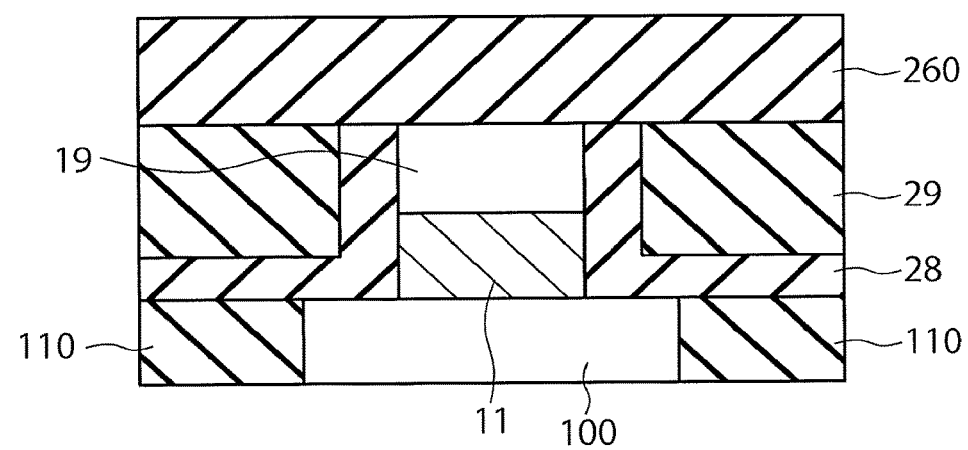
FIG. 20 is a cross-sectional view illustrating the process of manufacturing a magnetoresistive element according to the third embodiment.

Thereafter, the hard mask pattern 230a is etched and removed as shown in FIG. 19. Subsequently, an interlayer insulating film 260 is disposed on the entire surface of the semiconductor substrate as shown in FIG. 20.

Figure 21:
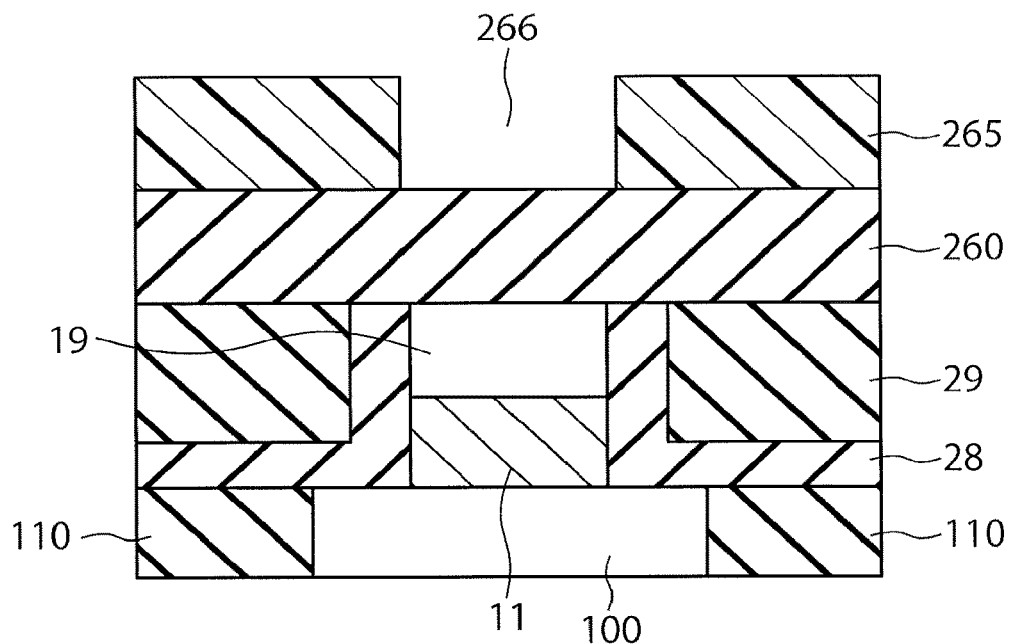
FIG. 21 is a cross-sectional view illustrating the process of manufacturing a magnetoresistive element according to the third embodiment.

Then, a photoresist 265 is applied to the interlayer insulating film 260, and patterned by photolithography to form an opening 266 in a region immediately above the MTJ element, as shown in FIG. 21.

Figure 22:
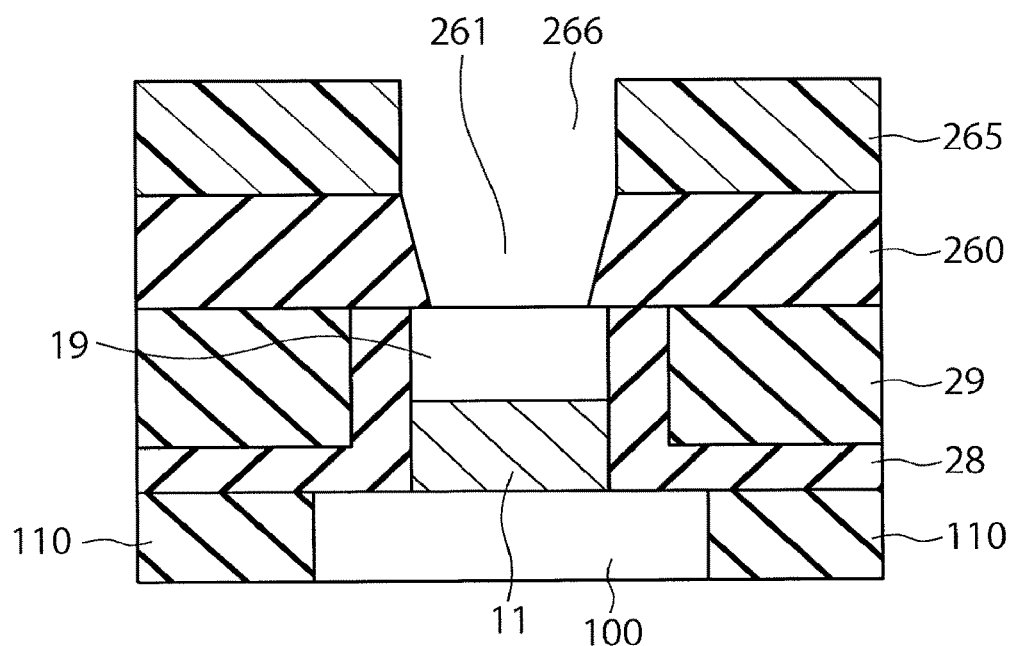
FIG. 22 is a cross-sectional view illustrating the process of manufacturing a magnetoresistive element according to the third embodiment.

Subsequently, an opening 261 is formed through the interlayer insulating film 260 by etching, using the photoresist 265 with the opening 266 as a mask, as shown in FIG. 22. The etching conditions are adjusted so that the top area of the opening 261 is larger than the bottom area due to the microloading effect.

Figure 23:
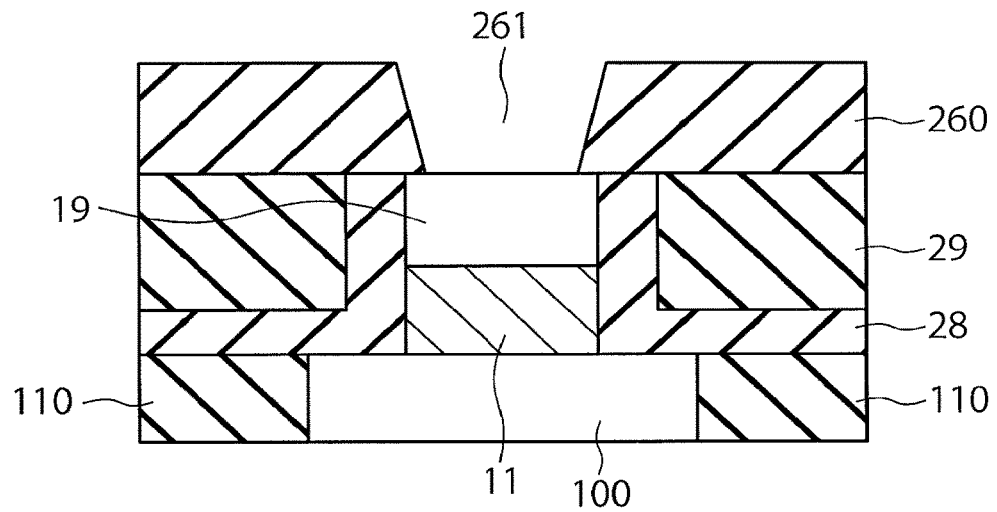
FIG. 23 is a cross-sectional view illustrating the process of manufacturing a magnetoresistive element according to the third embodiment.
Figure 24:
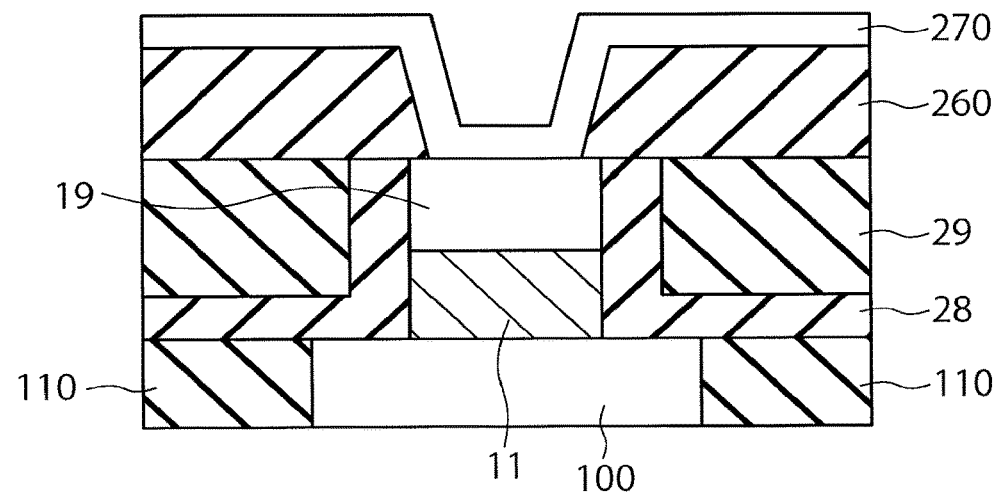
FIG. 24 is a cross-sectional view illustrating the process of manufacturing a magnetoresistive element according to the third embodiment.

Thereafter, the photoresist 265 is removed as shown in FIG. 23, and a carbon film 270 is disposed on the interlayer insulating film 260 and within the opening 261 so as to have a constant thickness on the bottom and the sidewalls of the opening 261 as shown in FIG. 24.

Figure 25:
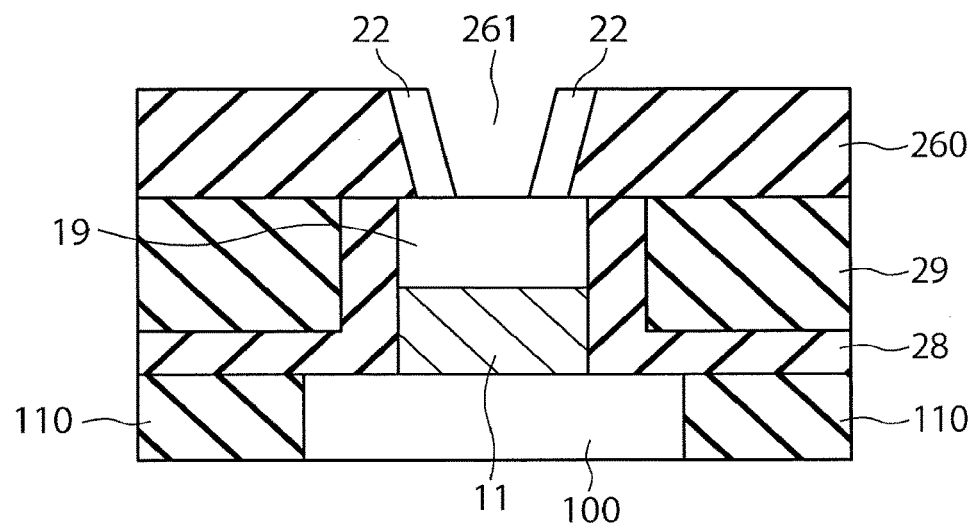
FIG. 25 is a cross-sectional view illustrating the process of manufacturing a magnetoresistive element according to the third embodiment.

Subsequently, the carbon film 270 is removed from the bottom and the outside of the opening 261 by anisotropic etching, as shown in FIG. 25. As a result, a sidewall 22 containing carbon is formed on the sidewall of the interlayer insulating film 260.

Figure 26:
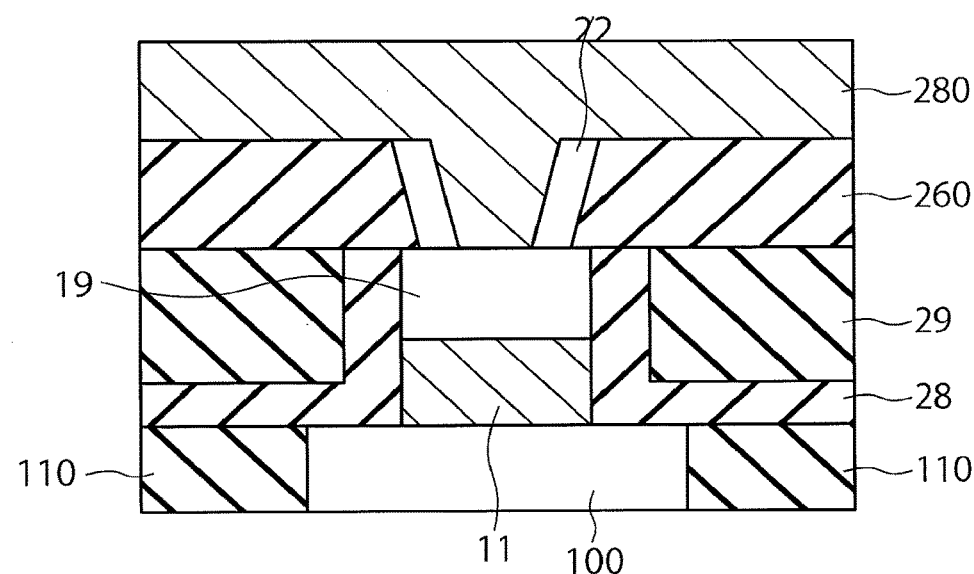
FIG. 26 is a cross-sectional view illustrating the process of manufacturing a magnetoresistive element according to the third embodiment.
Figure 27:
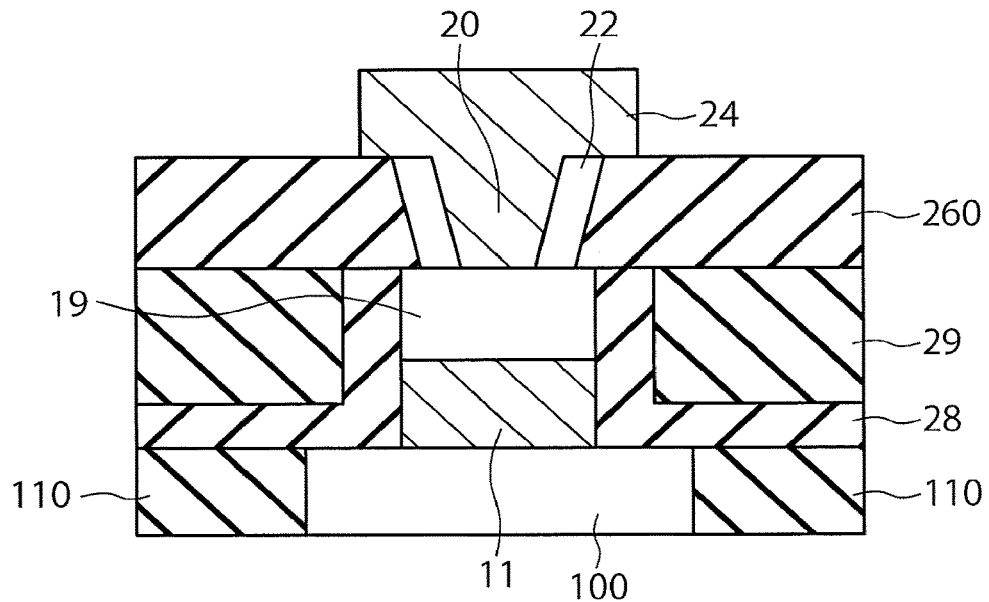
FIG. 27 is a cross-sectional view illustrating the process of manufacturing a magnetoresistive element according to the third embodiment.

Thereafter, a wiring material film 280 is disposed to cover the sidewall 22 as shown in FIG. 26. As a result, the wiring material film 280 fills the opening 261 to form a contact plug 20 on the multilayer structure 19 of the MTJ element. Subsequently, the wiring material film 280 is processed to form a wiring line 24 as shown in FIG. 27.

The magnetoresistive element manufactured by the method according to the third embodiment, like that manufactured by the first modification of the first embodiment, is capable of performing spin transfer torque magnetization switching at a high speed and with a low current, suppressing an increase in temperature, and suppressing the read signal intensity.

Fourth Embodiment

Figure 28:
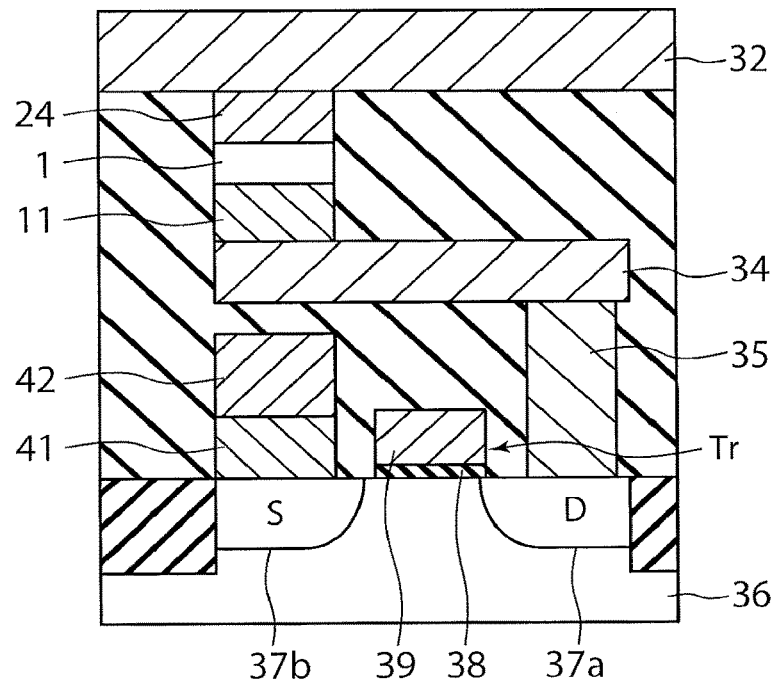
FIG. 28 is a cross-sectional view of a memory cell of a magnetic memory according to a fourth embodiment.

A magnetic memory according to a fourth embodiment will be described with reference to FIGS. 28 and 29. The magnetic memory according to the fourth embodiment includes at least one memory cell. FIG. 28 is a cross-sectional view of the memory cell. The memory cell 53 includes, as a storage element, a magnetoresistive element (MTJ element) according to any of the first to third embodiments and their modifications. In the following descriptions, the memory cell 53 includes the magnetoresistive element 1 according to the first embodiment as the storage element.

The top surface of the magnetoresistive element (MTJ element) 1 connects to a bit line 32 via a wiring line 24, as shown in FIG. 28. The lower surface of the MTJ element 1 connects to a drain region 37a of a source region 37b and the drain region 37a disposed in a surface region of a semiconductor substrate 36, via a wiring line 11, a leading electrode 34, and a plug 35. The drain region 37a, the source region 37b, a gate insulating film 38 disposed on the substrate 36, and a gate electrode 39 disposed on the gate insulating film 38 constitute a selection transistor Tr. The selection transistor Tr and the MTJ element 1 constitute one memory cell of an MRAM. The source region 37b connects to another bit line 42 via a plug 41. The wiring line 11 and the plug 35 may be directly connected to each other without having the leading electrode 34, and with the plug 35 being disposed below the wiring line 11. The bit lines 32 and 42, the electrodes 31 and 33, the leading electrode 34, and the plugs 35 and 41 are formed of W, Al, AlCu, or Cu.

The MRAM serving as the magnetic memory of the fourth embodiment includes a memory cell array, in which a plurality of memory cells, each being the one shown in FIG. 28, are disposed in rows and columns.

Figure 29:
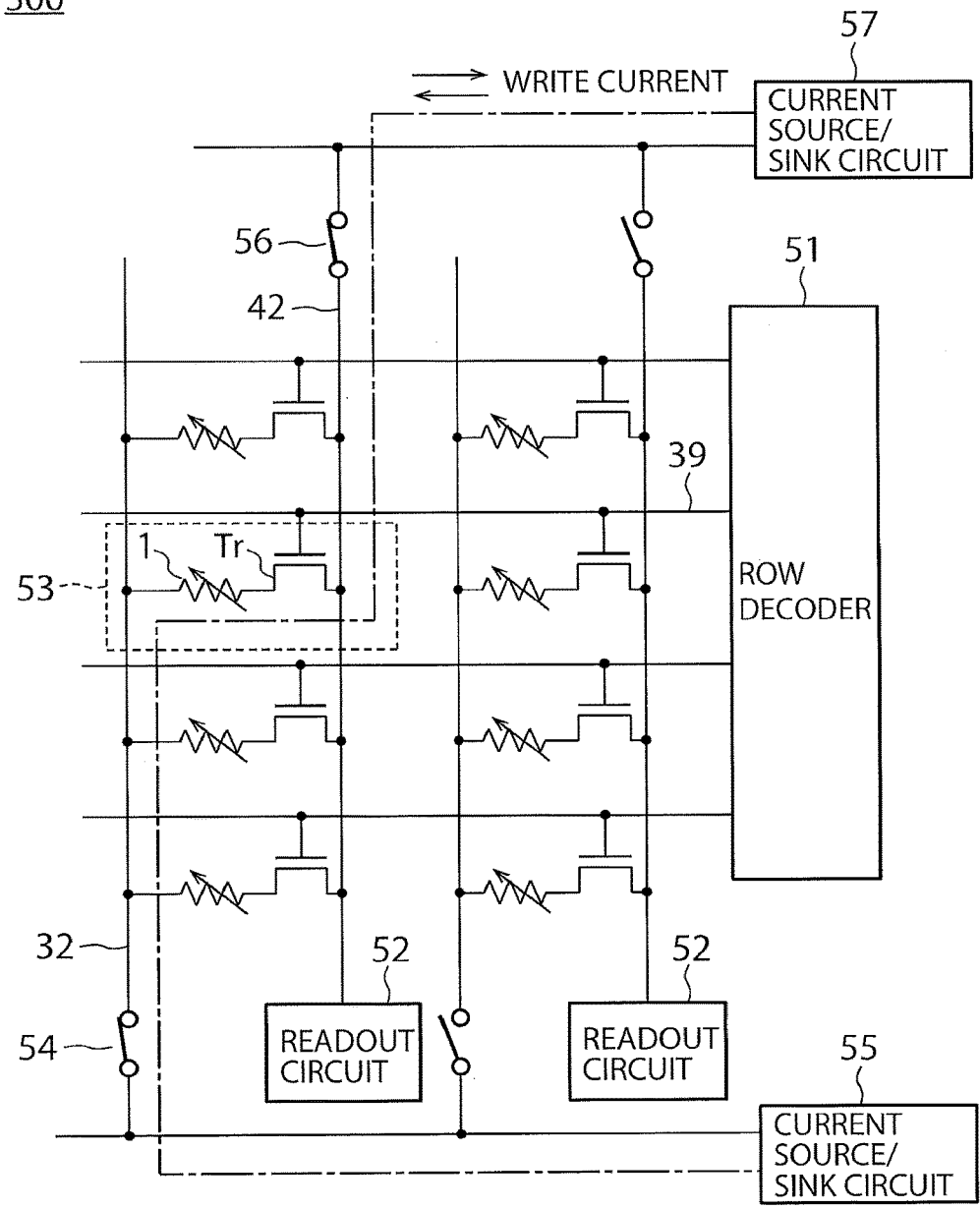
FIG. 29 is a circuit diagram illustrating the magnetic memory according to the fourth embodiment.

FIG. 29 is a circuit diagram of a magnetic memory 300 according to the fourth embodiment. FIG. 29 shows that memory cells 53 each including an MTJ element 1 and a selection transistor Tr are disposed in a matrix form. A first terminal of each of the memory cells 53 belonging to the same column is connected to the same bit line 32, and a second terminal is connected to the same bit line 42. The gate electrode (word line) 39 of the selection transistor Tr of each of the memory cells 53 belonging to the same row is connected to one another, and further connected to a row decoder 51.

The bit line 32 connects to a current source/sink circuit 55 via a switch circuit 54 such as a transistor. The bit line 42 connects to a current source/sink circuit 57 via a switch circuit 56 such as a transistor. The current source/sink circuits 55 and 57 supply a write current to the bit lines 32 and 42 connected thereto, or extract a current from the bit lines 32 and 42.

The bit line 42 also connects to a readout circuit 52. The readout circuit 52 may connects to the bit line 32 instead of the bit line 42. The readout circuit 52 includes a read current circuit and a sense amplifier.

In a write operation, the switch circuits 54 and 56 connected to the memory cell to be written, and the selection transistor Tr of the memory cell to be written are turned ON to obtain a current path passing through the memory cell to be written. One of the current source/sink circuits 55 and 57 serves as a current source circuit, and the other serves as a current sink circuit depending on the data to be written. As a result, a write current flows in a direction determined by the data to be written.

With respect to the write speed, the spin transfer torque writing may be performed with a current having a pulse width of a few nanoseconds to a few microseconds.

In a read operation, a read current that is satisfactorily low not to cause magnetization switching in the designated MTJ element 1 is supplied from the readout circuit 52 in the same manner as the write operation. The sense amplifier of the readout circuit 52 determines the resistance state of the MTJ element 1 by comparing, with a reference value, a current value or a voltage value of the MTJ element 1 resulting from a resistance value obtained from its magnetization state.

The current pulse width in the read operation is preferably narrower than the current pulse width in the write operation. This may reduce the possibility of erroneous operation caused by the read current. This is based on the fact that a narrower pulse width of a write current leads to a greater absolute value thereof.

As described above, a magnetic memory including a magnetoresistive element with a low saturation magnetization, a high perpendicular magnetic anisotropy, and a high MR ratio may be obtained according to the fourth embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetoresistive element, comprising:
   a multilayer structure including a first magnetic layer, a second magnetic layer disposed above the first magnetic layer, and a nonmagnetic layer disposed between the first magnetic layer and the second magnetic layer;
   a conductor disposed above an upper face of the second magnetic layer and including a lower portion d an upper portion, a cross-sectional area of the lower portion of the conductor in a plane perpendicular to a stacking direction of the multilayer structure being smaller than a cross-sectional area of the upper portion of the conductor in a plane perpendicular to the stacking direction of the multilayer structure and smaller than an area of the upper face of the second magnetic layer; and
   a carbon layer disposed on a side face of the conductor, a lower face of the carbon layer being located inside an outer circumference of the upper face of the second magnetic layer.

2. The element according to claim 1, wherein a cross-sectional area of the carbon layer in a plane perpendicular to the stacking direction of the multilayer structure at a lower portion of the side face is larger than a cross-sectional area in a plane perpendicular to the stacking direction at an upper portion of the side face.

3. A magnetoresistive element, comprising:
   a multilayer structure including a first magnetic layer, a second magnetic layer disposed above the first magnetic layer, and a nonmagnetic layer disposed between the first magnetic layer and the second magnetic layer;
   a conductor disposed above an upper face of the second magnetic layer and including a lower portion and an upper portion, a cross-sectional area of the lower portion of the conductor in a plane perpendicular to a stacking direction of the multilayer structurebeing smaller than a cross-sectional area of the upper portion of the conductor in a plane perpendicular to the stacking direction of the multilayer structure and smaller than an area of the upper face of the second magnetic layer; and
   a carbon layer disposed on a side face of the conductor, a lower face of the carbon layer being located inside an outer circumference of the upper face of the second magnetic layer, and the carbon layer including a portion in which a cross-sectional area in a plane perpendicular to the stacking direction of the multilayer structure reduces from a side of the lower portion to a side of the upper portion of the conductor.

4. The element according to claim 1, wherein a difference between a maximum length of the upper face of the second magnetic layer and a maximum length of a lower face of the lower portion of the conductor is 4 nm or more.

5. The element according to claim 1, wherein a length of the conductor at a lower face of the lower portion is 5 nm or more.

6. The element according, to claim 1,
wherein a maximum length at a lower portion of the second magnetic layer in a plane perpendicular to the stacking direction of the multilayer structure is smaller than a maximum length at an upper portion of the first magnetic layer in a plane perpendicular to the stacking direction of the multilayer structure.

7. The element according to claim 1, wherein the conductor contains at least one metal of W, Ti, Hf, Ta, Zr, and Nb, or at least one of a carbide of the at least one metal, a nitride of the at least one metal, and a boride of the at least one metal.

8. A magnetoresistive element, comprising:
a multilayer structure including a first magnetic layer, a second magnetic layer disposed above the first magnetic layer, and a nonmagnetic layer disposed between the first magnetic layer and the second magnetic layer;
a conductor disposed above an upper face of the second magnetic layer and including a lower portion and an upper portion, a cross-sectional area of the lower portion of the conductor in a plane perpendicular to a stacking direction of the multilayer structure being smaller than a cross-sectional area of the upper portion of the conductor in a plane perpendicular to the stacking direction of the multilayer structure and smaller than an area of the upper face of the second magnetic layer; and
a side layer disposed on a side face of the conductor and having a thermal conductivity and an electrical resistivity higher than these of the conductor respectively.

9. The element according to claim 8, wherein a cross-sectional area of the side layer in a plane perpendicular to the stacking direction of the multilayer structure at a lower portion of the side face is larger than a cross-sectional area in a plane perpendicular to the stacking direction at an upper portion of the side face.

10. The element according to claim 8, wherein the side layer includes a. portion in which a cross-sectional area in a plane perpendicular to the stacking direction of the multilayer structure reduces from a side of the lower portion to a side of the upper portion of the conductor.

11. The element according to claim 8, wherein a difference between a maximum length of the upper face of the second magnetic layer and a maximum length of a lower face of the lower portion of the conductor is 4 nm or more.

12. The element according to claim 8, wherein a length of the conductor at a lower face of the lower portion is 5 nm or more.

13. The element according to claim 8, wherein a maximum length at a lower portion of the second magnetic layer in a plane perpendicular to the stacking direction of the multilayer structure is smaller than a maximum length at an upper portion of the first magnetic layer in a plane perpendicular to the stacking direction of the multilayer structure.

14. The element according to claim 8, wherein the conductor contains at least one metal selected from W, Ti, Hf, Ta, Zr, and Nb, or at least one of a carbide of the at least one metal, a nitride of the at least one metal, and a boride of the at least one metal.

15. A magnetic memory, comprising:
the magnetoresistive element according to claim 1;
a transistor, in which one of a source and a drain is electrically connected to one of the first magnetic layer and the conductor;
a first wiring electrically connected to the other of the first magnetic layer and the conductor:
a second wiring electrically connected to the other of the source and the drain; and
a third wiring electrically connected to a gate of the transistor.

16. A magnetic memory, comprising:
the magnetoresistive element according to claim 8;
a transistor, in which one of a source and a drain is electrically connected to one of the first magnetic layer and the conductor;
a first wiring electrically connected to the other of the first magnetic layer and the conductor;
a second wiring electrically connected to the other of the source and the drain; and
a third wiring electrically connected to a gate of the transistor.

* * * * *